United States Patent
Ovtchinnikov et al.

(10) Patent No.: US 9,440,312 B2
(45) Date of Patent: Sep. 13, 2016

(54) LASER ABLATION PROCESS FOR MANUFACTURING SUBMOUNTS FOR LASER DIODE AND LASER DIODE UNITS

(71) Applicants: Alexander Ovtchinnikov, Worcester, MA (US); Igor Berishev, Holden, MA (US); Alexey Komissarov, Charlton, MA (US); Svletan Todorov, Oxford, MA (US); Pavel Trubenko, Northboro, MA (US)

(72) Inventors: Alexander Ovtchinnikov, Worcester, MA (US); Igor Berishev, Holden, MA (US); Alexey Komissarov, Charlton, MA (US); Svletan Todorov, Oxford, MA (US); Pavel Trubenko, Northboro, MA (US)

(73) Assignee: IPG PHOTONICS CORPORATION, Oxford, MA (US)

( * ) Notice: Subject to any disclaimer, the term of this patent is extended or adjusted under 35 U.S.C. 154(b) by 454 days.

(21) Appl. No.: 13/904,174

(22) Filed: May 29, 2013

(65) Prior Publication Data
US 2014/0353362 A1    Dec. 4, 2014

(51) Int. Cl.
| | |
|---|---|
| B23K 26/00 | (2014.01) |
| B23K 26/36 | (2014.01) |
| B23K 26/40 | (2014.01) |
| H05K 3/00 | (2006.01) |
| H01L 23/00 | (2006.01) |
| H01S 5/022 | (2006.01) |

(52) U.S. Cl.
CPC ......... *B23K 26/367* (2013.01); *B23K 26/0622* (2015.10); *B23K 26/364* (2015.10); *B23K 26/40* (2013.01); *B23K 2203/172* (2015.10); *H01L 24/83* (2013.01); *H01L 2224/291* (2013.01); *H01L 2224/83192* (2013.01); *H01L 2224/83801* (2013.01); *H01L 2924/12042* (2013.01); *H01S 5/02236* (2013.01); *H01S 5/02272* (2013.01); *H05K 3/0026* (2013.01); *H05K 3/0052* (2013.01); *Y10T 29/53174* (2015.01)

(58) Field of Classification Search
CPC   B23K 26/063; B23K 26/367; B23K 26/409; H01L 2224/83009; H01L 2224/83192; H01L 2224/83801; H01L 24/83; H05K 3/0026; H05K 3/0052; Y10T 29/53174
USPC   ........ 257/723, 724, 691, 508, 513; 228/170; 219/121.68; 29/739
See application file for complete search history.

(56) References Cited

U.S. PATENT DOCUMENTS

| | | | |
|---|---|---|---|
| 2002/0050489 A1* | 5/2002 | Ikegami | B23K 26/0732 219/121.69 |
| 2011/0038150 A1* | 2/2011 | Woodgate et al. | 362/235 |

* cited by examiner

*Primary Examiner* — Dana Ross
*Assistant Examiner* — Joseph Iskra
(74) *Attorney, Agent, or Firm* — Yuri Kateshov, Esq.; Timothy J. King, Esq.

(57) ABSTRACT

A method for manufacturing submounts for laser diodes includes the steps of providing a base configured with a ceramic carrier and a metal layer deposited upon the substrate. The method further includes using a pulsed laser operative to generate a plurality of pulses which are selectively trained at predetermined pattern on the metal layer's surface so as to ablate the desired regions of the metal layer to the desired depth. Thereafter the base is divided into a plurality of submounts each supporting a laser diode. The metal layer includes a silver sub-layer deposited upon the ceramic and having a thickness sufficient to effectively facilitate heat dissipation.

8 Claims, 4 Drawing Sheets

FIG. 1
Prior Art
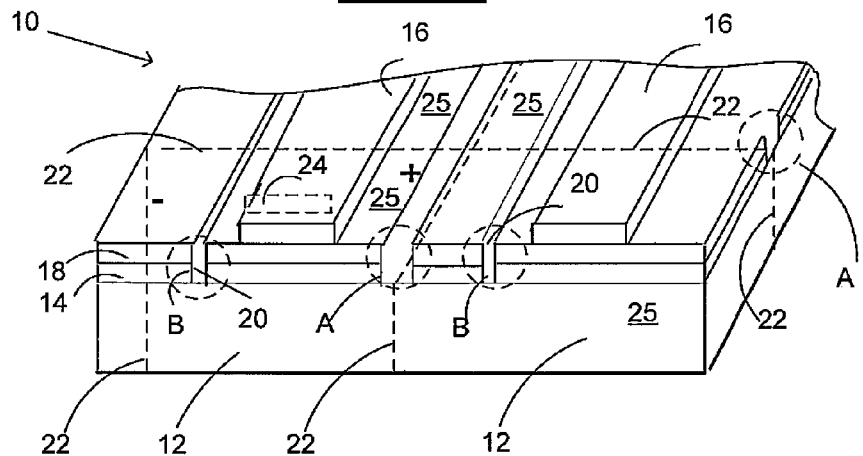
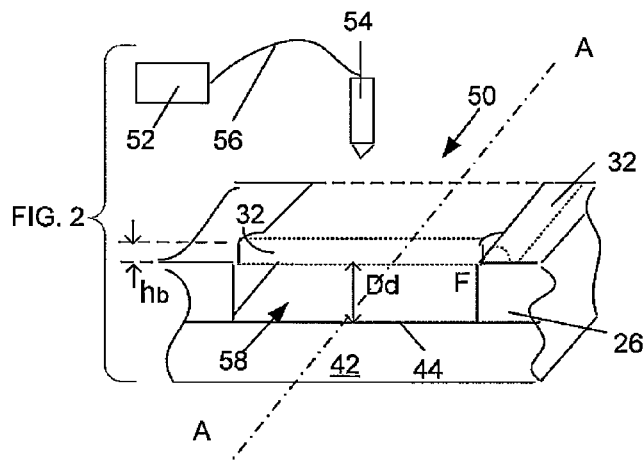
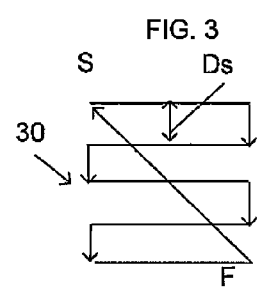
FIG. 3
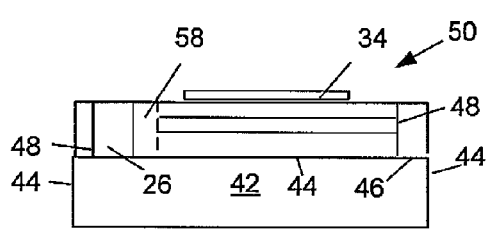
FIG. 4
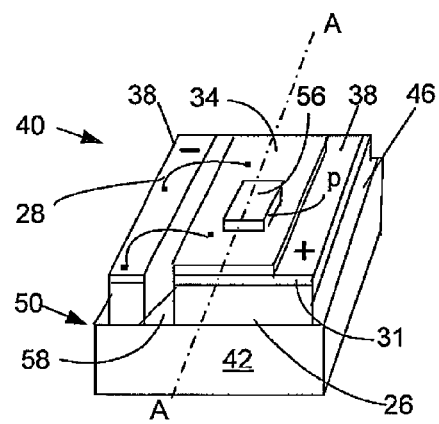
FIG. 5

Ablation depth vs Pulse repetition rate    Speed 7.3m/sec Spacing 6.1um

Ablation depth vs. Linear scan speed. Freq. 750kHz Spacing 6.1um
1ns

US 9,440,312 B2

LASER ABLATION PROCESS FOR MANUFACTURING SUBMOUNTS FOR LASER DIODE AND LASER DIODE UNITS

CROSS-REFERENCE TO RELATED APPLICATION

This applications is a continuation-in-part of claims priority, in part, to PCT/US2011/104901 filed on Jun. 17, 2011 and fully incorporated herein by reference.

BACKGROUND OF THE DISCLOSURE

1. Technical Field

The present invention relates to a method of mass producing laser diode units, each including a planar submount and laser diode mounted thereon, by using a high power pulsed laser operative to ablate the desired surface regions of the submount's metalized layer in a time- and cost-effective manner without formation of burrs.

2. Prior Art

High power semiconductor lasers have broad applications in various fields including, among others, military and industry. The rapid progress achieved in manufacturing semiconductor devices may be, in part, attributed to a planar technology in accordance with which a one-piece substrate is divided into a plurality of semiconductor devices by using masks made of photoresist.

The advances in high power laser diodes can be generally attributed to improvements of diode lasers performance and optimization of packaging architectures all based on the planar technology. The major characteristics of high power lasers, such as maximum useful output power, wavelength, lifetime are not only limited by the diode or semiconductor structure itself, but also strongly by the quality of the package including configuration and fabrication methods of heat sinks or sub-mounts. As known, the packaging process contributes strongly, about more than 50%, to the production costs of a high power diode laser. Accordingly, the laser diode package must be cost efficient. Needless to say, packaging techniques, including manufacturing of bases, are currently a very active area of research and development.

It is well known that both operating characteristic and longevity of laser diodes are strongly affected by the junction temperature. Edge emitting laser diodes operating at high current require a heat spreader to be placed between the device active region and the metal carrier package. When arranged in high densities, heat dissipation becomes even more critical. To minimize the severity of this problem, typically thin film metals with high thermal conductivity are used for heat sinks. Materials have to be thoroughly selected and combined so as to provide the desired topology and a combination of metals has to be thoroughly designed. Thus, along with a cost effective packaging technique, as power density increases, high reliability submounts should be configured to safeguard the stability of the active device, which is sensitive to changes in temperature.

Referring to FIG. 1, a typical process for fabricating submounts includes forming a base 10. The latter may be configured with a substrate carrier 12 made, as a rule, from thermo-conductive ceramic material, such as Beryllium oxide (BeO) or aluminum nitride (AlN). Further, a metal sub-layer 14 is plated on substrate 12, and a top metal sub-layer 18 is deposited atop sub-metal layer 14. The metal sub-layers, in combination, are configured to spread heat towards carrier 12 and provide a diffusion barrier. The equidistantly spaced soldering strips 16, coupling configuration 10 to laser diodes, which are provided after base 10 is divided into a plurality of submounts 25, as disclosed below, are applied to top metal layer 18 and typically made of Gold/Tin alloys ("AuSn"). The configuration 10 is then processed to have a plurality of insulation grooves 20 between electrical contacts of opposite polarity. Thereafter, base 10 is cut into a plurality of uniform submounts 25 along cutting lines 22. Finally, laser diodes are soldered to respective submounts.

Before cutting base 10 into submounts by a cutting saw, metal layer 14 is to be removed along cutting lines 22 and along isolating grooves 20 in respective regions A and B. Otherwise, a plurality of burrs can be formed while a saw (not shown) cuts configuration into submounts 25 which is unacceptable since it may affect the desired positioning of a laser diode or chip 24.

The removal of metal layers 14 and 18 is realized by photolithography and includes the use of photomasks made from photosensitive material or photoresist. The mask is applied to the surface and processed so that photoresist image is formed on the surface of the metal layer. To transfer this image into this layer, typically, two conventional etching methods are used: wet etching and ion milling. The wet etching is fast and, therefore, cost-efficient. However, during this process, because multiple metal sub-layers melt at different temperatures, resulting cutting edges are not planar which eventually leads to an angled position of laser diodes 24 in which one edge, for example, emitting edge extends in a plane higher than that of the opposite diode's end. The angled position may critically affect the operation of the diode. Yet another undesirable consequence is the formation of undercuts. The latter, in turn, detrimentally affects further alignment operations. The ion dry etching can provide sharp, planar vertical edges. However, this technique is slow. For example, etching 15-30 micron metal layer, typically takes about thirty (30) hours. In mass production such a long process is unacceptably expensive.

In both techniques, when photoresist is applied to a relatively porous metal surface, it soils the surface. The cleaning of the surface may not be entirely successful. If the surface is still not completely free from photoresist, subsequent technological procedures may not be effective. For example, a soldering material may interact with the photoresist which detrimentally affects the coupling between a substrate and laser diode.

Common to the above-discussed techniques, it should be noted that it is very difficult to control its parameters once the metal removal process starts. For example, removing metal material for subsequent cutting of a one-piece planar base into a plurality of submounts does not always require the removal of all metal sub-layers. In contrast, forming an isolation groove requires ablating metal layers in their entirety. The impossibility of manipulating parameters associated with both techniques during the photolithographic process certainly contributes to relatively high costs associated with the production of laser diode units.

A need therefore exists for an improved method of manufacturing submounts for laser diodes.

A further need exists for a cost effective, quality oriented method of removing metal from the surface of a multilayer configuration used as a base for laser diodes.

SUMMARY OF THE DISCLOSURE

The disclosed method is based on the use of a pulsed laser operative to irradiate the surface of the base to be processed so as to remove a metal layer within in the desired surface regions. In other words, in contrast to the above-disclosed photolithographic techniques, the disclosure teaches ablating the surface of a submount by a laser. The laser ablation allows a submount-manufacturing process to be efficient and cost-effective.

Preferably, but not necessarily, a laser is configured as a pulsed, sub-nanosecond fiber laser irradiating a metal surface. The irradiation of metal is performed in the region of cutting lines and isolating grooves. The edges resulting from of laser ablation are clean, sharp and flat.

In accordance with one aspect of the disclosure, a laser is operative to emit a laser beam characterized by the desired pulse repetition rate, pulse duration, peak power and wavelength. The beam characteristics are selected so that ablated metal does not melt, but vaporizes. Otherwise, metal drops may form bumps on the surface around ablated regions which would compromise the desired planar position of a laser diode and/or create the possibility of shorting electrical circuitry.

The thickness of material to be irradiated may vary depending on the task at hand. For example, irradiating metal material for isolation grooves may require different laser parameters than those needed for the removal metal material along the cutting lines. Furthermore, quite often the operating laser parameters deviate from the desired parameters or the selected parameters. Therefore, a further aspect of the disclosure relates to controlling parameters of the laser partaking in a laser diode unit manufacturing.

BRIEF DESCRIPTION OF THE DRAWINGS

The above and other features and advantages of the disclosed process and assembled laser diode units are discussed hereinbelow in detail in conjunction with the following drawings, in which:

FIG. 1 is a perspective view of a typical heat sink used for assembling laser diode units.

FIG. 2 is a perspective view of a submount configured in accordance with the disclosure.

FIG. 3 illustrates an ablation pattern on the surface of the submount of FIG. 2

FIG. 4 is a front view of a laser diode unit with surface regions ablated in accordance with the disclosed method.

FIG. 5 is a perspective view of the disclosed laser diode unit manufactured in accordance with the disclosed method.

SPECIFIC DESCRIPTION

Figure 6:
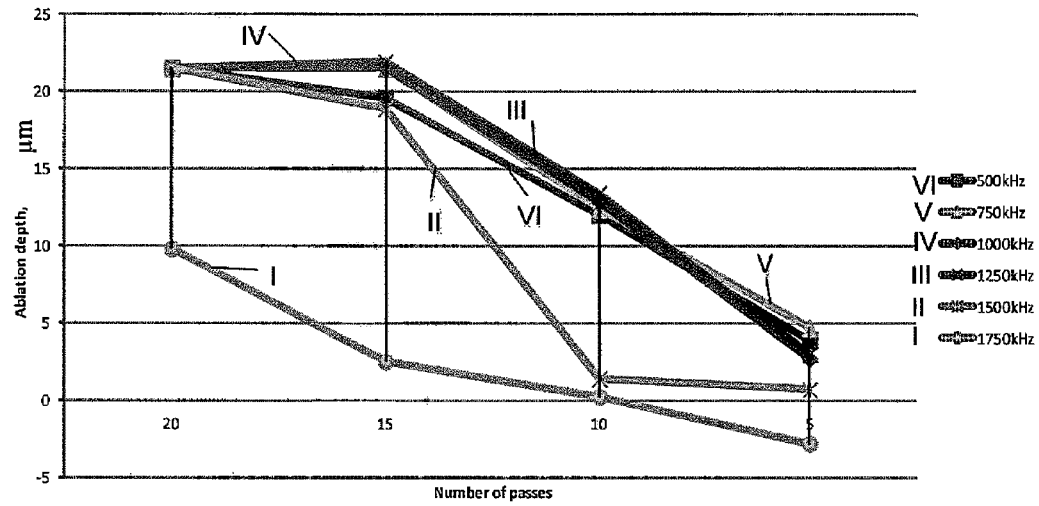
FIG. 6 is a computer generated graph illustrating an ablation depth as a function of a pulse repetition rate.

The reference will now be made in detail to the disclosed configurations. The drawings are far from precise scale and do not show well known to an artisan in semiconductor industry additional layers. The word "couple" and similar terms do not necessarily denote direct and immediate connections, but also include connections through intermediate elements.

FIG. 2 diagrammatically illustrates the disclosed ablation process incorporating a laser 52 which has preferably, but not necessarily, a pulsed fiber laser configuration operating in a nanosecond-sub-nanosecond range. The laser 52 is operative to emit a pulsed output delivered to a laser head 54 by a delivery fiber 56. The configuration of laser 52 may be selected from solid state, semiconductor, gas and die lasers, but preferably is a fiber laser operating at a wavelength ranging between a few hundreds of nanometers and about two microns. The laser head 54 and a base 50 are displaceable relative to one another along a predetermined path so as to irradiate metal layers within the desired regions of the base including isolation grooves 58 and dicing lines 44.

The efficiency of the disclosed laser irradiation process depends on a variety of parameters selected so as to ablate a metal layer at the desired depth Dd in the shortest possible time without, however, accumulating metal drops on the surface adjacent to the ablated region. Such accumulations, known to one of ordinary skill in the art as burrs 32, may or may not be formed contingent on metals and laser parameters. If formed, burrs 32 extend parallel and perpendicular to emitting edges and may detrimentally affect the desired operation of a laser diode unit in different ways. The burrs 32 may be formed and have a height $h_b$ exceeding a distance from the surface of base 50 at which the edge of a mounted laser diode emits light, they can interfere with the propagation of the laser beam and destroy planarity of base 50.

The laser parameters, among others, include pulse duration, pulse repetition rate, peak power, and wavelength. Other parameters, referred to hereinafter as process parameters, are equally important and may include a number of passes, which laser head 56 should complete so to irradiate a metal layer at the desired depth, and a pattern spacing, i.e., the distance between adjacent stretches of the path bridging opposite sides of the region to be laser processed.

Turning briefly to FIG. 3, an exemplary single linear pass of laser head 30 is defined between points S and F and covers the entire square of the region to be ablated. A pattern spacing Ds is a distance between adjacent parallel linear stretches of the path. Note however that path 30 may have a variety of patterns, as known to one of ordinary skill. As will be disclosed below, a proper selection of both laser and process parameters allows for mass production of high quality laser diode units in a time- and, therefore, cost-efficient manner. The desired parameters are tailored to a combination of metals and geometry of base 50.

Returning to FIG. 2, base 50 includes a ceramic carrier 42 made from BeO or AlN. A multilayer metal sequence includes, among others, a relatively thick silver (Ag) sub-layer 26 upon carrier 42. The Ag sub-layer 26 has several advantages over gold which is widely used in manufacturing bases for laser diodes. Compared to gold, silver has higher thermo-conductivity and lower electro-resistivity. Accordingly, the heat, which is generated when a laser diode is in use, effectively spreads out across and through Ag sub-layer 26. Furthermore, the Ag layer is configured with a thickness determined to provide a submount with a cumulative thereto-expansion coefficient substantially matching a coefficient of thermo-expansion of a laser diode further soldered to the metal layer.

Referring to FIG. 4 in addition to FIG. 2, base 50 further has a plurality of spaced soldering layers 34 applied to the top of the metal layer next to respective regions which each are shown by respective dash lines and define isolating groove 58 formed after ablation. At this point metal layer 26 of base 50 is ready to be processed by a laser beam which irradiates regions corresponding to respective isolation grooves 58 and either before or after the latter metal surface regions above dicing lines 44 in carrier 42. Advantageously the metal sub-layers along dicing regions, which extend parallel to a longitudinal axis A-A of base 50, are irradiated so as to form a narrow region 46. The region 46 is dimensioned so that an incidental contact between a cutting saw and metal material during cutting through base 42 is prevented. The same configuration may be formed along dicing lines extending perpendicular to axis A-A.

FIG. 5 illustrates an individual laser diode unit 40 manufactured in accordance with the disclosed method to include base 50 as disclosed above and a laser diode or chip 56 which is soldered to the submount, for example, by its P side. The isolating groove 58 separates differently polarized contacts "+" and "−" 38 with the latter being coupled to chip 56 by means of electrical wires 28. The edges formed as a result of laser ablation are sharp, the surface supporting chip 56 is planar and even if some remnants of the burrs can be found, their height is smaller than a reference value, which may be, for example, a height of laser diode 56 relative to the surface of solder strip 34, which may be from about 1 μm to about 3 μm. The overall thickness of laser unit 40 varies between about 50 μm and about 5 mm The silver sub-layer 26 may be configured with a thickness up to about 200 μm.

One of unarguable advantages of the disclosed method utilizing a laser is the possibility of controlling process parameters. This is particularly convenient when the irradiation depth is not required to be uniform. Clearly, isolation groove 58 should terminate in the plane of carrier 42 so as to isolate contacts 38 of opposite polarity from one another. However, ablated metal regions above dicing lines 44 should not necessarily extend all the way down to ceramic carrier 42. It is possible to stop ablating at a distance from carrier 42 and finish dicing through remaining metal by a dicing saw. Accordingly, having all the data regarding laser and process parameters collected in look up tables helps select optimal values corresponding to acceptable levels of the these parameters.

Referring to FIG. 6, ablation depth Da is illustrated as a function of the number of passes at different pulse repetition rates of an Ytterbium ("Yb") fiber laser operating at 1060 nm wavelength. Provided laser's linear speed (7.3 m/sec) and pattern spacing (6/1 μm) and pulse duration (1 ns) are fixed, the laser operating at frequencies 1250 kHz, 1000 kHz and 750 kHz represented by respective graphs III, IV and V irradiate metalized layers of FIG. 2 with the smallest number of passes—15. Note that a horizontal stretch of the shown graphs indicates the completion of metal irradiation. Higher frequencies, particularly graph I corresponding to 1750 kHz, show less satisfactory results. The lowest frequency of 500 kHz corresponding to graph VI, requires greater number of passes to reach the desired depth than other frequencies corresponding to respective graphs III, IV and V.

Figure 7:
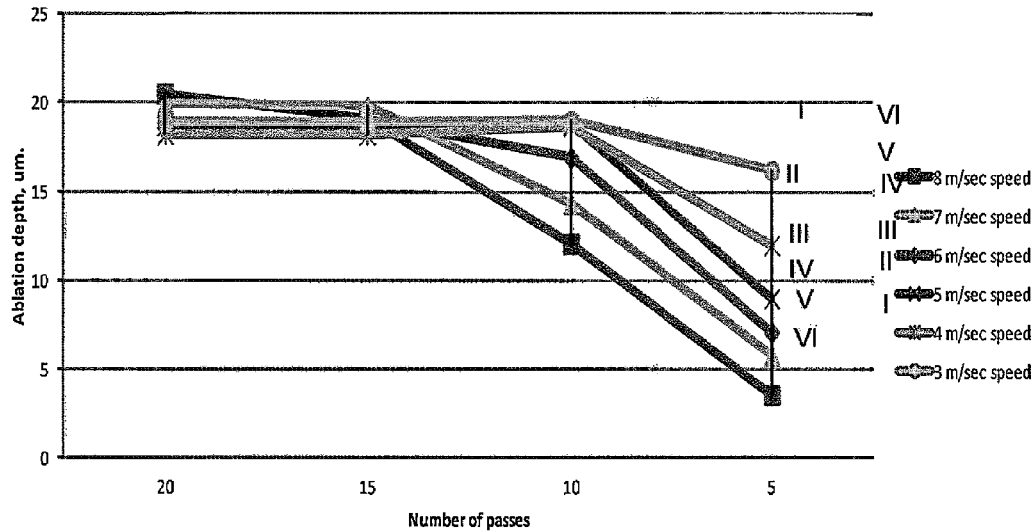
FIG. 7 is a computer generated graph illustrating an ablation depth as a function of a linear speed at which a pulsed laser scans the surface to be treated (further referred to as linear scan speed).

FIG. 7 illustrates the effect a linear speed of the laser head has on the ablation depth, at the same fixed values of a pulse duration and spacing as those of FIG. 6 and at a fixed repetition rate of 750 kHz in a 5-20 passes range of passes. As can be seen, the ablation depth linearly increases as the number of passes approaches a 10-pass mark regardless of a selected speed. At 3, 4, 5 and 6 m/sec speeds, corresponding to respective graphs I, II, III and IV, the ablation depth remains substantially unchanged which indicates that at these speeds the removal of metal is completed around a 10-pass mark. The depth continues to insignificantly increase at the highest selected 8 m/sec speed with the increased number of passes. The laser head displaceable at the second highest speed of 7 m/sec fully irradiates metal around a 15-pass mark.

Figure 8:
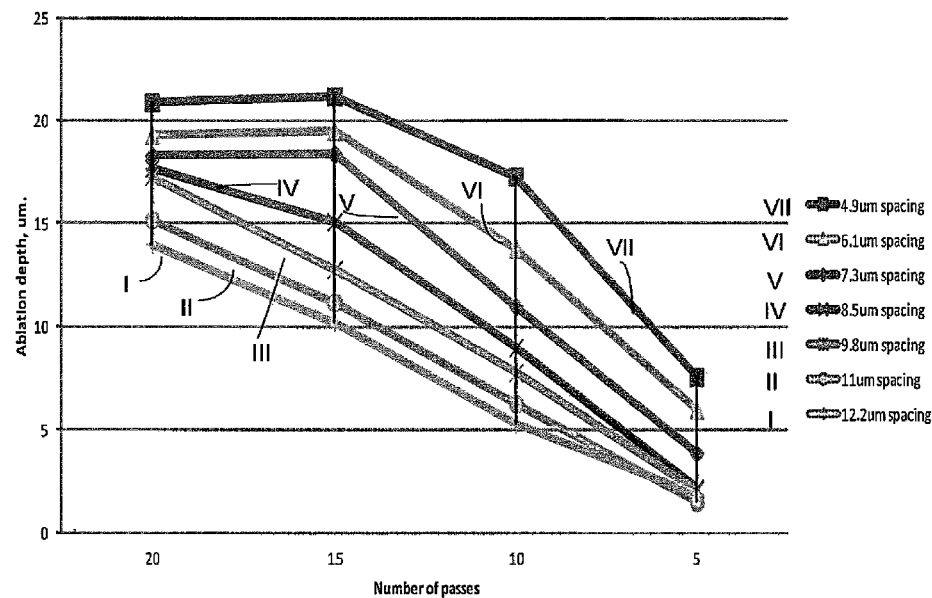
FIG. 8 is a computer generated graph illustrating an ablation depth as a function of a pitch, i.e., a distance between adjacent parallel laser paths.

FIG. 8 shows that generally with a spacing decreasing from 12.2 μm (graph I) to 4.9 μm (graph VII) an ablation depths increases at fixed values of a repetition rate and linear speed. FIG. 11 illustrates a complicated relationship between a burr height and spacing. The largest spacing of 12.2 μm (graph I) corresponds to rather an average burr height which slightly increases as the number of passes increases.

Figure 9:
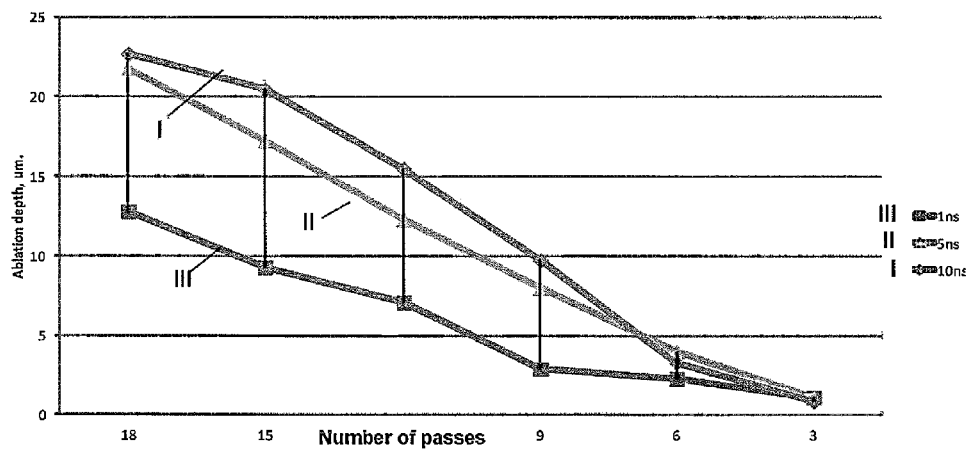
FIG. 9 is a computer generated graph illustrating an ablation depth as a function of pulse duration.

FIG. 9 shows the values of ablation depth as a function of the number of pulses for different pulse durations. As the pulse duration decreases, so does the ablation depth, as represented by graphs I, II and III corresponding to respective 10, 5 and 1 ns-long pulses, except for a small initial range between 3 and 5 passes, where a 5 ns-long pulse irradiates more material than a 10 nm-long one.

Figure 10:
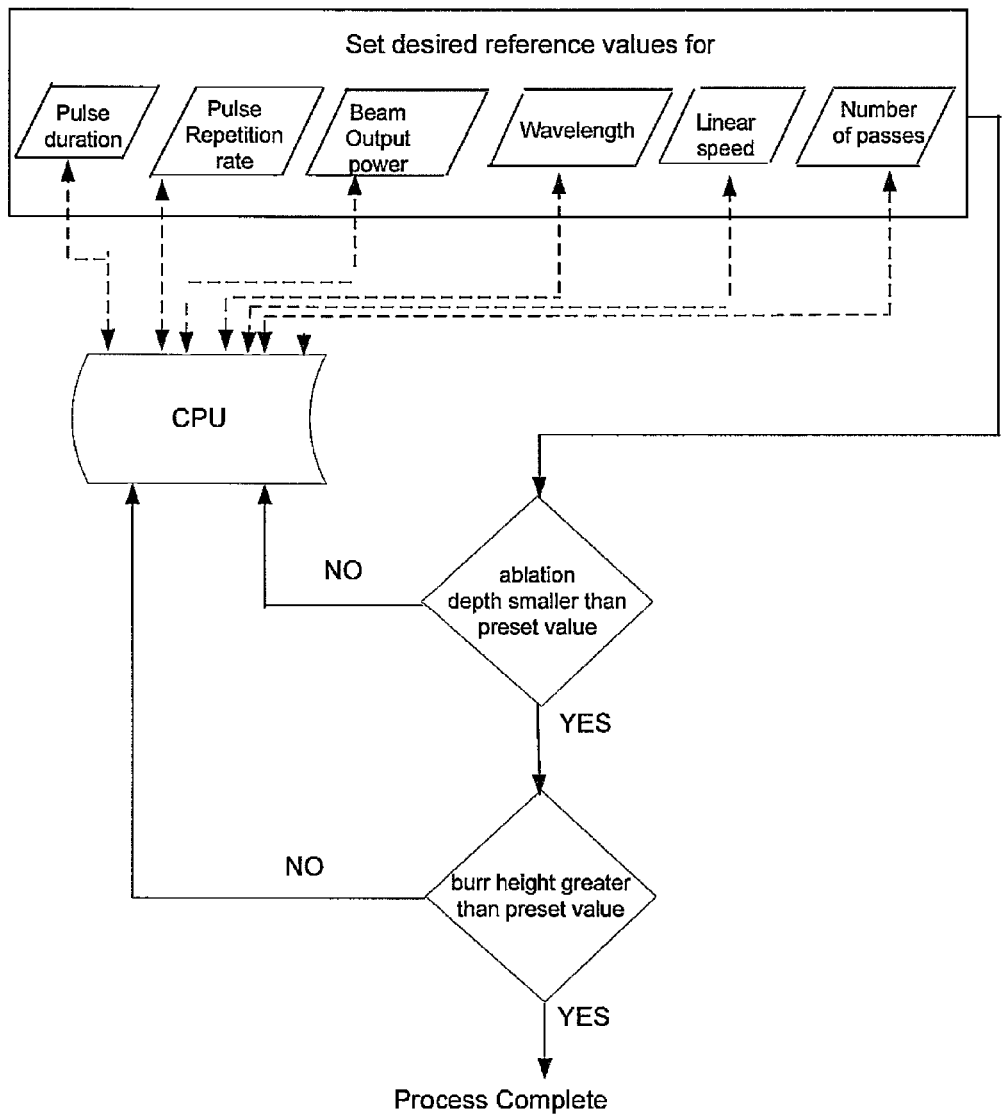
FIG. 10 is a chart diagrammatically illustrating the disclosed method.

FIG. 10 illustrates a summary of the disclosed method of manufacturing laser diode submount and configuration thereof in a simplified diagrammatic manner. As mentioned above, a numerous data is collected and arranged in look up tables. The data depends on a variety of parameters discussed above and, in addition, on a wavelength that may range from about 500 nm to about 10 μm and submount thickness reaching up to tens of microns. Of course a laser beam power affects the results of the disclosed method and varies within a range between about 0.5 W and about 500 W.

The process and laser parameters, which include pulse duration varying in a nanosecond—sub-nanosecond range, such as femto- and picosecond sub-ranges, pulse repetition rate, beam output power, wavelength, linear speed, submount thickness and number of passes, can be easily controlled once the submount thickness and metal layer composition are known. If an ablation depth and/or burr height do not correspond to the respective desired values stored in a central processing unit (CPU), the latter may control any of the illustrated parameters until both the depth and burr height correspond to the desired preset values. For example, having reached the desired ablation depth, but still a high burr, the CPU may increase a number of passes. If deeper depth is undesirable, the CPU may output a signal reducing the laser's output power so that only a bur is processed while the desired depth stays unaffected. Furthermore, it is possible to control a wavelength of laser beam by selectively utilizing lasers operating at respective different wavelengths.

Having described at least one of the preferred embodiments of the present invention with reference to the accompanying drawings, it is to be understood that the invention is not limited to those precise embodiments. Various changes, modifications, and adaptations including different wavelengths, fiber parameters and rare-earth dopants may be effected therein by one skilled in the art without departing from the scope or spirit of the invention as disclosed above.

The invention claimed is:

1. A method for manufacturing laser diode units, comprising:
    providing a base including a ceramic carrier and a metal layer on the ceramic carrier;
    generating a plurality of laser light pulses while controlling a laser beam parameter which is selected from the group consisting of a pulse repetition rate, pulse duration, beam output power, linear speed and number of passes and a combination thereof;
    training laser light pulses at a predetermined pattern on a metal layer surface, thereby ablating the metal layer so as to form a plurality of ablated regions each having a desired depth while causing accumulation of burrs on the metal layer surface next to respective ablated regions;

dicing the ceramic carrier with a cutting saw, thereby producing a plurality of submounts; and soldering an inner surface of a high power laser diode to each submount, wherein the laser beam parameter is controlled so that the burrs do not extend beyond an outer surface of the soldered laser diode.

2. The method of claim 1 further comprising depositing a plurality of spaced soldering strips on the metal layer surface before dicing of the base.

3. The method of claim 1, wherein the ablation of the metal layer includes providing isolating grooves between contacts of respective different polarities, and reducing a thickness of the metal layer along each of a plurality of dicing lines in the carrier to the desired depth.

4. The method of claim 3, wherein the metal layer is irradiated to the desired depth along the dicing line at the desired depth corresponding to an entire thickness of the metal layer.

5. The method of claim 3, wherein the metal layer along the dicing lines is irradiated to the desired depth corresponding to a fraction of an entire thickness of the metal layer, thereby cascading sides of the metal layers located next to respective dicing lines.

6. The method of claim 3, wherein the ablation of the metal layer along the dicing lines includes:

forming regions with the reduced thickness of the metal layer, each of the regions being broader than the dicing line, guiding the cutting saw through each of the regions; and sawing the ceramic carrier along the cutting lines, thereby providing each of the submounts with the metal layer spaced inwards from an edge of the ceramic carrier.

7. The method of claim 1, wherein the ablation of the metal layer includes controlling a laser beam parameter selected from the group which consists of a pulse repetition rate, pulse duration, beam output power, linear speed and number of passes and a combination thereof so as to provide a desired height of the burr insufficient for the burr to extend over the laser diode.

8. The method of claim 1, wherein the metal layers is configured with a silver sublayer.

* * * * *